(12) United States Patent
Behzad

(10) Patent No.: US 7,570,926 B2
(45) Date of Patent: *Aug. 4, 2009

(54) RF TRANSCEIVER WITH COMPACT STACKER MIXER DESIGN FOR MULTIPLE FREQUENCY CONVERSION

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/820,359

(22) Filed: Jun. 19, 2007

(65) Prior Publication Data

US 2007/0243848 A1   Oct. 18, 2007

Related U.S. Application Data

(63) Continuation of application No. 10/643,420, filed on Aug. 19, 2003, now Pat. No. 7,233,774.

(60) Provisional application No. 60/443,594, filed on Jan. 30, 2003.

(51) Int. Cl.
  *H04B 1/40* (2006.01)
  *H04B 1/16* (2006.01)
(52) U.S. Cl. .................. 455/76; 455/192.2; 455/257; 455/324
(58) Field of Classification Search .......... 455/192.1, 455/192.2, 76, 255, 257, 260, 313, 315, 323, 455/324, 333; 327/113; 375/344, 376
See application file for complete search history.

(56) References Cited

U.S. PATENT DOCUMENTS

| | | | | |
|---|---|---|---|---|
| 5,440,268 A | * | 8/1995 | Taga et al. ................. | 329/308 |
| 6,021,323 A | * | 2/2000 | Vagher ....................... | 455/324 |
| 6,029,060 A | * | 2/2000 | Ashby ........................ | 455/326 |
| 6,708,044 B1 | * | 3/2004 | Puknat et al. ............ | 455/552.1 |
| 6,850,745 B2 | * | 2/2005 | Anand et al. ............... | 455/260 |
| 7,020,449 B2 | * | 3/2006 | Shi ........................ | 455/234.1 |
| 7,224,722 B2 | * | 5/2007 | Shi et al. .................... | 375/219 |
| 7,233,774 B2 | * | 6/2007 | Behzad ........................ | 455/76 |
| 2003/0078011 A1 | * | 4/2003 | Cheng et al. ................. | 455/73 |
| 2003/0138032 A1 | * | 7/2003 | Shi et al. .................... | 375/219 |
| 2003/0138034 A1 | * | 7/2003 | Shi et al. .................... | 375/219 |
| 2004/0137852 A1 | * | 7/2004 | Shi et al. ..................... | 455/73 |

* cited by examiner

*Primary Examiner*—Nguyen Vo
(74) *Attorney, Agent, or Firm*—Garlick Harrison & Markison; James A. Harrison

(57) ABSTRACT

A single chip radio transceiver includes circuitry that enables received wideband RF signals to be down-converted to baseband frequencies and baseband signals to be up-converted to wideband RF signals prior to transmission without requiring conversion to an intermediate frequency. The circuitry includes a low noise amplifier, automatic frequency control circuitry for aligning a local oscillation frequency with the frequency of the received RF signals, signal power measuring circuitry for measuring the signal to signal and power ratio and for adjusting frontal and rear amplification stages accordingly, and finally, filtering circuitry to filter high and low frequency interfering signals including DC offset. The circuitry further includes a multi-stage mixer that produces current signal outputs from each mixing stage to a subsequent stage thereby avoiding a need for intermediate transconductance and output stages to convert between current signals and voltage signals.

21 Claims, 9 Drawing Sheets

FIG. 5    frequency correction stage alternative frequency mixer module frequency mixer module 400

RF TRANSCEIVER WITH COMPACT STACKER MIXER DESIGN FOR MULTIPLE FREQUENCY CONVERSION

CROSS REFERENCE TO RELATED APPLICATION

The present U.S. Utility Patent Application claims priority pursuant to 35 U.S.C. § 119(e) to the following U.S. Provisional Patent Application which is hereby incorporated herein by reference in their entirety and made part of the present U.S. Utility Patent Application for all purposes:
  1. U.S. Provisional Application Ser. No. 60/443,594, entitled "Direct-Conversion CMOS Transceiver with Automatic Frequency Control for IEEE 802.11a Wireless LAN," filed Jan. 30, 2003, expired.

The present U.S. Utility Patent Application claims priority pursuant to 35 U.S.C. § 120, as a continuation, to the following U.S. Utility Patent Application which is hereby incorporated herein by reference in its entirety and made part of the present U.S. Utility Patent Application for all purposes:
  1. U.S. Utility application Ser. No. 10/643,420 filed Aug. 19, 2003, entitled "RF Transceiver with Compact Stacked Mixer Design for Multiple Frequency Conversion," which is now U.S. Pat. No. 7,233,774.

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

Active mixers used in direct conversion radios as well as radios that employ an intermediate conversion step, typically comprise input transconductance elements, switches and an output load. These active mixers often have varying output signal characteristics due to environmental conditions, such as temperature, and process and manufacturing variations. These varying output signal characteristics can, for example, result in a mixer producing an errant local oscillation signal that affects the accuracy of an output signal's frequency. Having inaccurate output frequencies can result in many undesirable outcomes, including unwanted signal filtering by a downstream filter. Accordingly, using active mixers that can compensate for the effects of frequency drift that is often present is beneficial. Some current mixers being designed have multiple stages for these and other reasons. Mixers that are designed to have multiple stages, however, utilize significant IC real estate. As the pressure to reduce devices sizes continues to drive design, a continuing need exists for multiple mixer stage designs that are more efficient in terms of design and power consumption.

SUMMARY OF THE INVENTION

The present invention provides a multi-stage mixer for use in a variety of applications that is more efficient in terms of design and power consumption wherein a transconductance stage produces a current signal to a first mixing stage which, in turn, produces a current signal to a second mixing stage without first converting the current signal back into a voltage signal. Accordingly, load devices (typically inductive coils) to turn the current into a voltage are not included as well as at least one transconductance stage to convert a voltage input received from the first mixing stage back into a current for mixing with current signals in the second mixing stage. Thus, the current signals are only converted to voltage signals at the output stage.

More specifically, the inventive mixer module, however, includes only one voltage to current conversion block and a plurality of mixing stages wherein each mixing stage produces a mixed output current that is input to a subsequent mixing stage. As such, the number of inductive coils at the output stage to convert current signals into voltage signals are reduced and the number of input stages that convert an input voltage signal into a current signal are reduced. These input and output stage circuit elements are not required to convert an output current back into voltage signals prior to being input to a subsequent mixer of a mixer module having a plurality of mixers stages because the mixer stages are configured to receive and multiply the frequency components of signals all as current signals. As such, only one voltage to current input stage is required and inductive coils are only required in the final output stage.

One embodiment of the present invention includes a single integrated circuit radio transceiver which includes circuitry that enables received wideband RF signals to be down-converted to baseband frequencies and baseband signals to be up-converted to wideband RF signals prior to transmission without requiring conversion to an intermediate frequency. The present invention includes a radio transceiver that includes a mixer module that produces frequency compensated local oscillation signals for mixing with a received RF signal to down-convert the received RF to baseband (or to a low intermediate frequency (low IF) signal) and for mixing a baseband or a low IF to up-convert to RF signals for transmission. More particularly, a multi-stage mixer is utilized that is more efficient that prior designs for direct conversion between RF and baseband.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
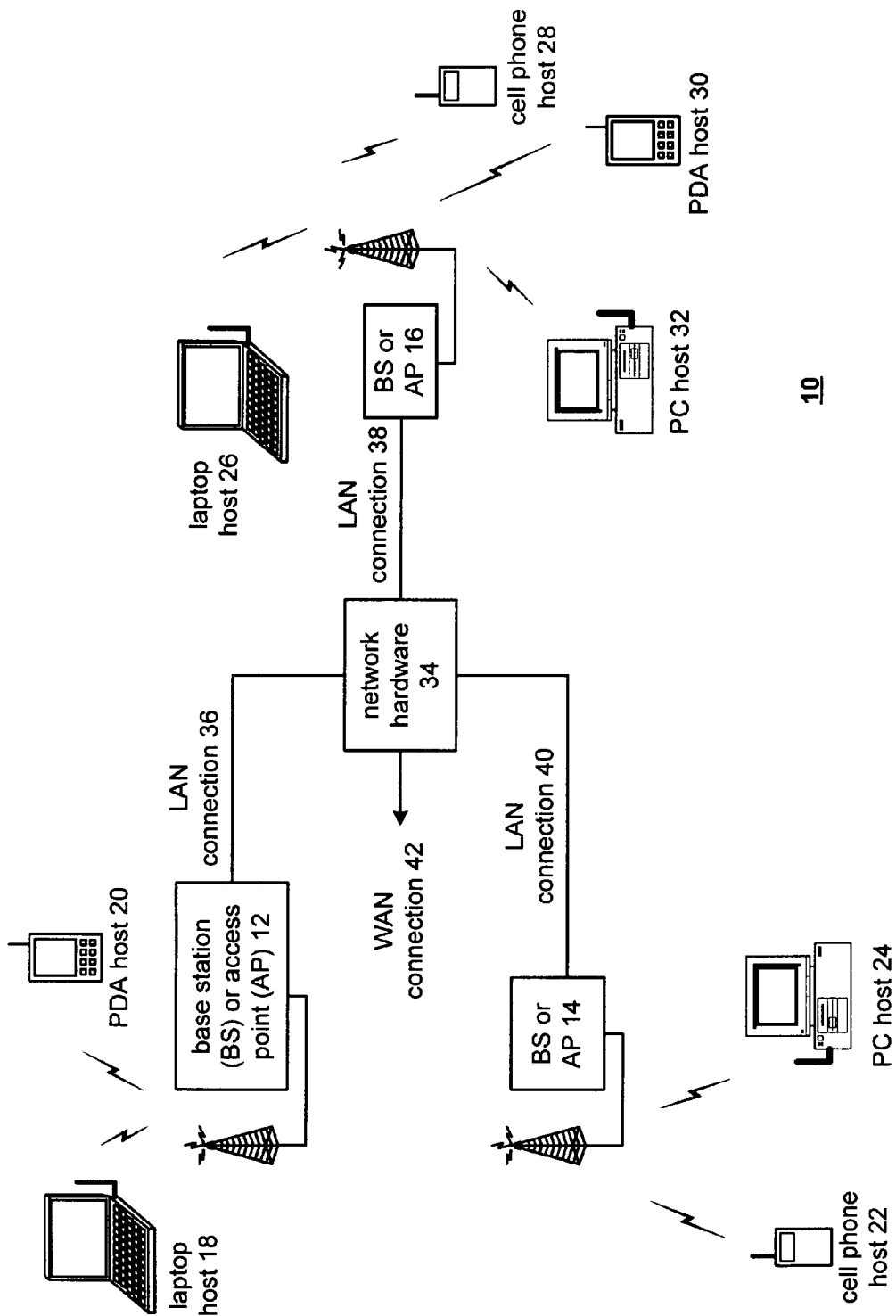
FIG. 1 is a functional block diagram illustrating a communication system that includes a plurality of base stations and/or access points, a plurality of wireless communication devices and a network hardware component.

FIG. 1 is a functional block diagram illustrating a communication system 10 that includes a plurality of base stations or access points (AP) 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or AP 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
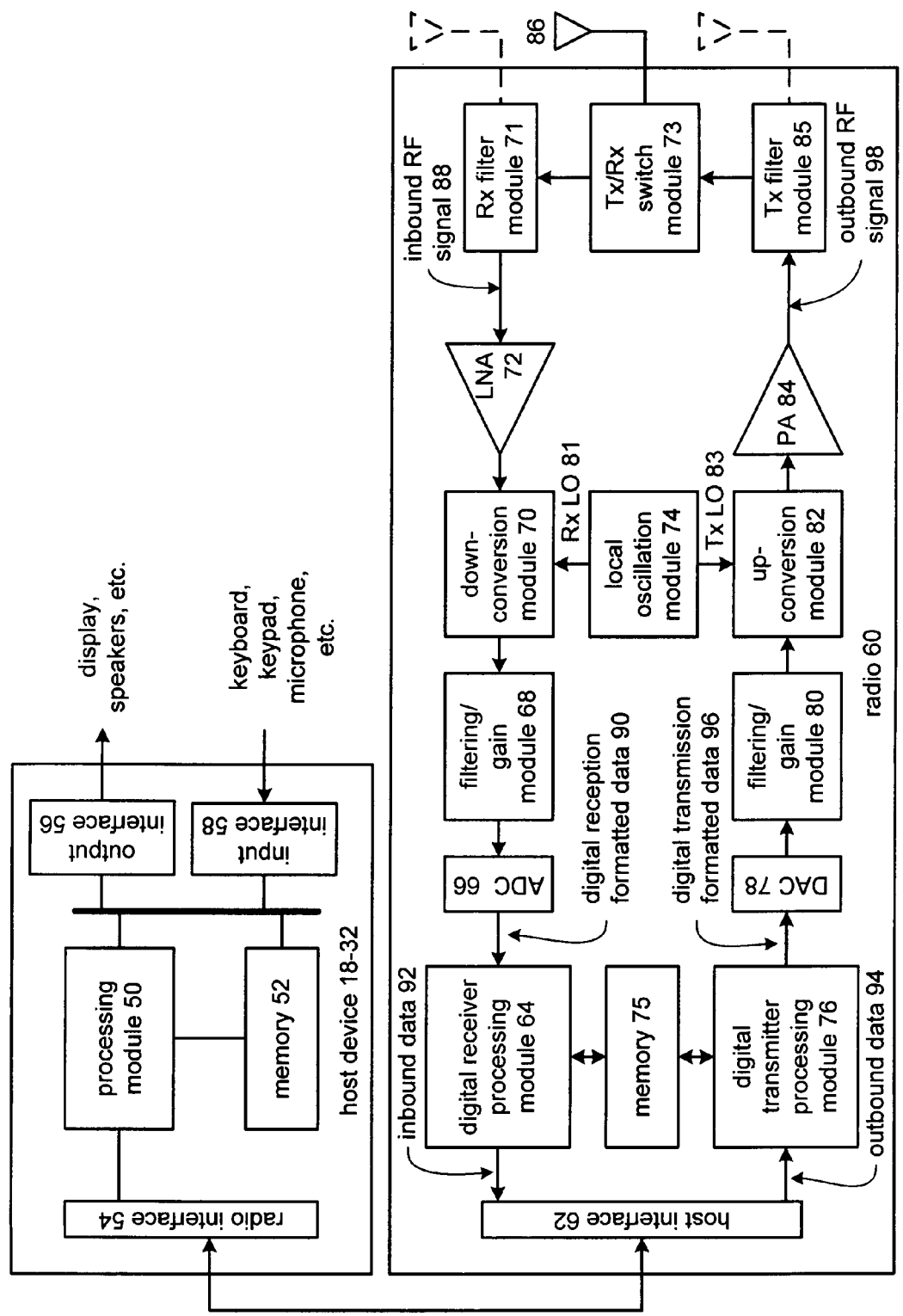
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, receiver filter module 71, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, modulation. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. Local oscillation module 74 is, one embodiment of the invention, a multi-stage mixer as described herein. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. Local oscillation module 74 is, one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for an up-conversion module 82 and a down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband or RF by the up-conversion module 82 and down-conversion module 70, respectively. Accordingly, the local oscillation module 74 includes circuitry for adjusting an output frequency of a local oscillation signal provided therefrom. As will be explained in greater detail, below, the local oscillation module 74 includes a multi-stage that receives a frequency correction input that it uses to adjust an output local oscillation signal to produce a frequency corrected local oscillation signal output. While one embodiment of the present invention includes local oscillation module 74, up-conversion module 82 and down-conversion module 70 that are implemented to perform direct conversion between baseband and RF, it is understand that the principles herein may also be applied readily to systems that implement an intermediate frequency conversion step at a low intermediate frequency.

Figure 3:
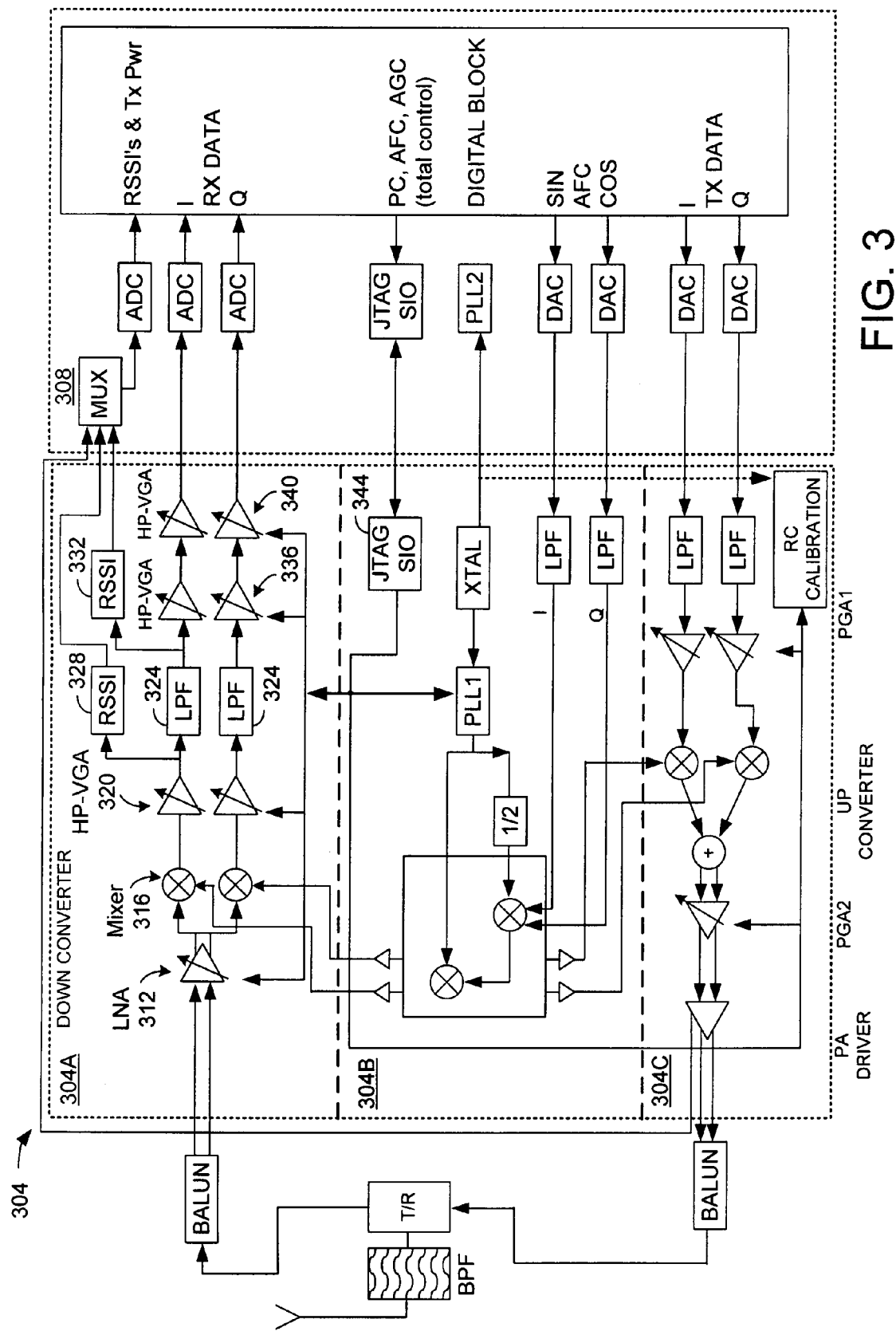
FIG. 3 is a functional schematic diagram of a transceiver formed according to one embodiment of the present invention.

FIG. 3 is a functional schematic diagram of a direct conversion radio transceiver that includes one embodiment of the present invention. Referring now to FIG. 3, a transceiver system comprises radio circuitry 304 that is coupled to baseband processing circuitry 308. The radio circuitry 304 performs filtering, amplification, frequency calibration (in part) and frequency conversion (down from the RF to baseband and up from baseband to the RF). Baseband processing circuitry 308 performs the traditional digital signal processing in addition to partially performing the automatic frequency control. As may be seen, the single chip radio circuitry 304 is coupled to receive radio signals that are initially received by the transceiver and then converted by a Balun signal converter, which performs single end to differential conversion for the receiver (and differential to single end conversion for the transmitter end). The Balun signal converters are shown to be off chip-in FIG. 3, but they may be formed on-chip with radio circuitry 304 as well. Similarly, while the baseband processing circuitry 308 is shown off-chip, it also may be formed on-chip with radio circuitry 304.

Radio circuitry 304 and, more particularly, circuitry portion 304A, includes a low noise amplifier 312 that is coupled to receive RF signals from a transceiver port. The low noise amplifier 312 then produces an amplified signal to mixers 316 that are for adjusting and mixing the RF with a local oscillation signal. The outputs of the mixers 316 (I and Q components of quadrature phase shift keyed signals) are then produced to a first HP-VGA 320.

The outputs of the first HP-VGA 320 are then produced to a first RSSI 328 as well as to a low pass filter 324. The outputs of the low pass filter 324 are then produced to a second RSSI 332, as well as to a second HP-VGA 336 and a third HP-VGA 340 as may be seen in FIG. 3.

In operation, the first RSSI 328 measures the power level of the signal and interference. The second RSSI 332 measures the power level of the signal only. The baseband processing circuitry 308 then determines the ratio of the RSSI measured power levels to determine the relative gain level adjustments of the front and rear amplification stages. In the described embodiment of the invention, if the power level of the signal and interference is approximately equal to or slightly greater than the power level of the signal alone, then the first amplification stages are set to a high value and the second amplification stages are set to a low value. Conversely, if the power level of the signal and interference is significantly greater than the power of the signal alone, thereby indicating significant interference levels, the first amplification stages are lowered and the second amplification stages are increased proportionately.

Circuitry portion 304B includes low pass filters for filtering I and Q component frequency correction signals and mixer circuitry for actually adjusting LO signal frequency. The operation of mixers and phase locked loop for adjusting frequencies is known. Circuitry portion 304B further includes JTAG (Joint Test Action Group, IEEE1149.1 boundary-scan standard) serial interface (SIO) circuitry 344 for transmitting control signals and information to circuitry portion 304A (e.g., to control amplification levels) and to a circuitry portion 304C (e.g., to control or specify the desired frequency for the automatic frequency control).

A portion of the automatic frequency control circuitry that determines the difference in frequency between a specified center channel frequency and an actual center channel frequency for a received RF signal is formed within the baseband circuitry in the described embodiment of the invention. This portion of the circuitry includes circuitry that coarsely measures the frequency difference and then measures the frequency difference in the digital domain to obtain a more precise measurement and to produce frequency correction inputs to circuitry portion 304B.

Finally, radio circuitry portion 304C includes low pass filtration circuitry for removing any interference that is present after baseband processing as well as amplification, mixer and up-converter circuitry for preparing a baseband signal for transmission at the RF.

Figure 4:
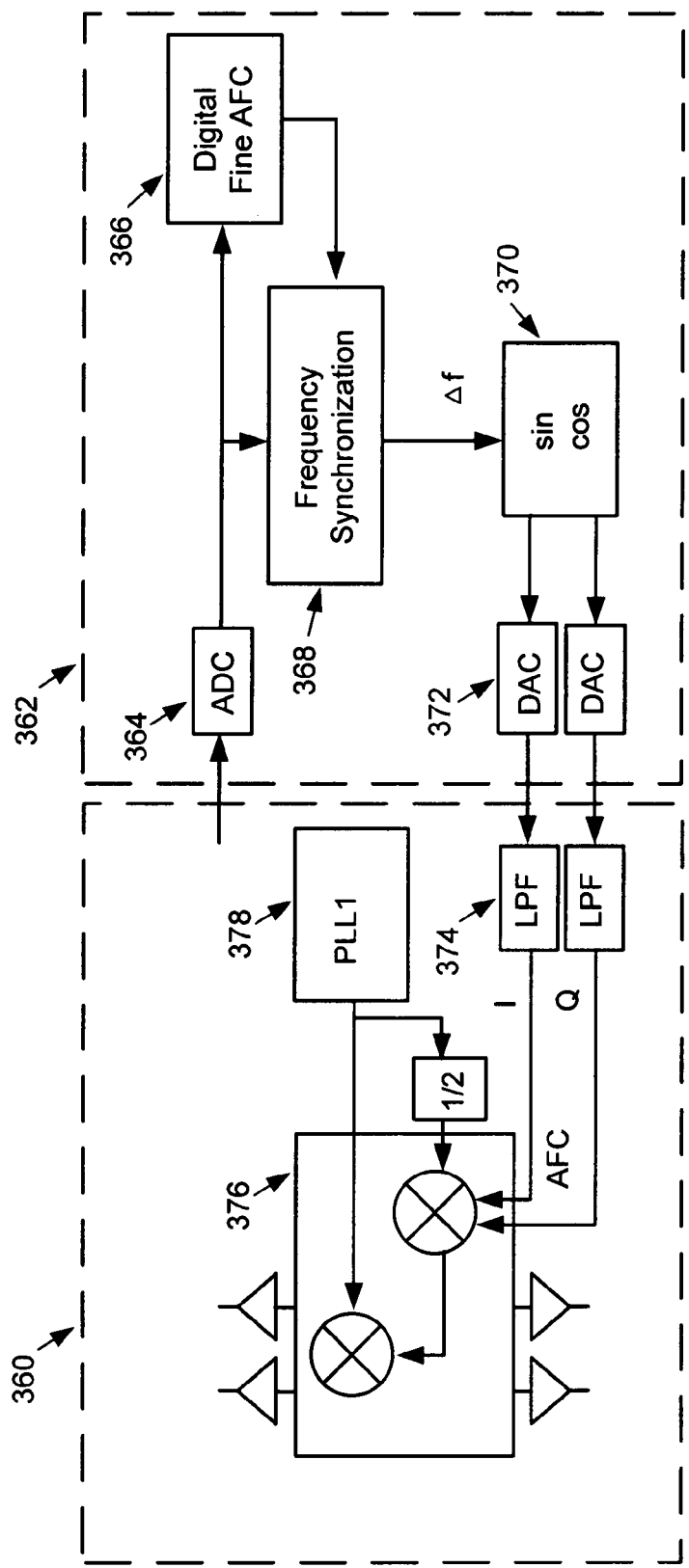
FIG. 4 is a functional schematic diagram of an automatic frequency control (AFC) circuit formed according to one described embodiment of the invention.

FIG. 4 is a functional schematic diagram of an automatic frequency control (AFC) circuit formed according to one described embodiment of the invention. The AFC circuit of FIG. 4 comprises an RF signal processing portion 360 and a baseband signal processing portion 362. Generally, portion 360 is for adjusting an LO signal frequency. Portion 362 is for determining the difference in center channel frequencies between the received RF and the expected frequency value for the received signal.

An analog-to-digital converter (ADC) 364 is used to convert the received signal from analog to digital. ADC 364 is coupled to receive an RF signal that has been down-converted to produce a digitally converted signal to frequency synchronization circuitry 368 that measures the frequency difference in a coarse degree of resolution. Digital frequency control circuitry 366 performs its measurements and calibration in the digital domain and provides its results to frequency synchronization circuitry 368 to adjust the frequency difference of frequency synchronization circuitry 368 with a fine degree of resolution.

Frequency synchronization circuitry 368, as a part of determining the difference in center channel frequency for the received signal and an expected value, receives and interprets a pilot signal that defines the expected center channel frequency. Accordingly, after measuring the actual center channel frequency of the received RF, frequency synchronization circuitry 368 is able to determine the frequency difference. Frequency synchronization circuitry 368 then produces a signal defining the difference in center channel frequency for the received signal and an expected value to a signal generator 370. It is understood that the pilot channel is transmitted as a part of standard wireless network communication protocols for signal control and synchronization purposes.

Signal generator 370, upon receiving the difference in center channel frequency for the received signal and an expected value, produces quadrature phase shift keyed (I & Q) outputs for the received frequency difference (reflecting a frequency adjustment amount) to a pair of digital-to-analog converters (DAC's) 372. The analog outputs of the pair of DAC's 372 are then passed to low pass filters 374 and are then up-converted to the RF. The I and Q RF signal components are then produced to mixer circuitry 376 that also receives a specified input from phase locked loop circuitry 378 to produce a received RF having a specified center channel frequency. It is understood that mixer circuitry 376 (including PLL circuitry 378) further receives control signals from baseband processing circuitry (not shown in FIG. 4) specifying the expected center channel frequency that is specified in the aforementioned pilot channel.

Figure 5:
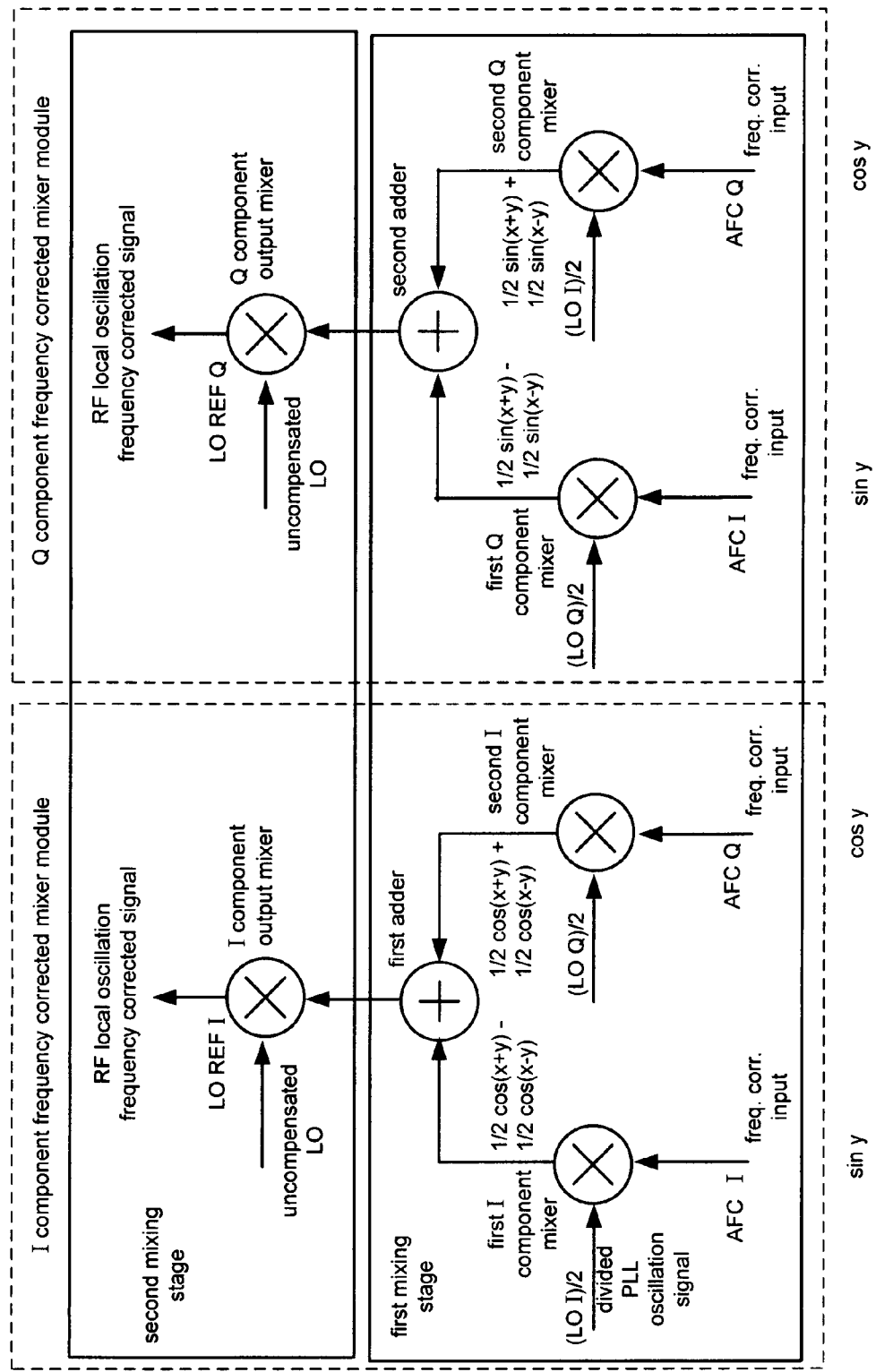
FIG. 5 is a functional schematic block diagram of a frequency correction stage formed according to one embodiment of the present invention.

FIG. 5 is a functional schematic block diagram of a frequency correction stage formed according to one embodiment of the present invention. The corrected local oscillation produced by the circuit of FIG. 5 may then be produced to a mixer for up-converting or down-converting a signal. The frequency correction stage of FIG. 5 which demonstrates but one application of the inventive circuit and method generally comprises an I component frequency corrected mixer module and a Q component frequency corrected mixer module. The structure of the I and Q component frequency corrected mixer modules is similar, though the inputs to a plurality of mixers of the I and Q component frequency corrected mixer modules are coupled differently. The I and Q component frequency corrected mixer modules each comprise first and second mixing stages that further comprise mixers there within. For example, the first mixing stage of the I component frequency corrected mixer module comprises a first I component mixer that is coupled to receive a divided phase locked loop oscillation signal and a frequency correction input for an I component. The output of the first I component mixer is equal to:

½ cos(x+y)−½ cos(x−y)

wherein a sine wave is used to represent an I component signal and a cosine wave is used to represent a Q component signal. The first mixing stage of the I component frequency corrected mixer module further includes a second I component mixer which is coupled to receive a local oscillation signal and a frequency correction input for a Q component. The output of the second I component mixer is equal to:

½ cos(x+y)+½ cos(x−y).

The outputs of the first and second I component mixers are then produced to a first adder wherein the four component terms are summed to produce an output that is equal to cos (x+y). The first adder output is then produced to the second mixing stage of the I component frequency corrected mixer module and, more specifically, to an I component output mixer that is further coupled to receive an uncompensated local oscillation signal. The I component output mixer, upon mixing the input received from the first adder with the uncompensated local oscillation signal, produces an RF local oscillation frequency corrected output I component signal.

Similarly, the Q component frequency corrected mixer module comprises first and second mixing stages. The first mixing stage includes a first Q component mixer and a second Q component mixer. The first Q component mixer receives a Q component local oscillation signal and an I component frequency correction input. The second Q component mixer receives an I component local oscillation signal and a Q component frequency correction input. The output of the first Q component mixer is equal to:

½ sin(x+y)−½ sin(x−y).

The output of the second Q component mixer is equal to:

½ sin(x+y)+½ sin(x−y).

The outputs of the first and second Q component mixers are then produced to a second adder that sums the received outputs from the first and second Q component mixers to produce an output that is equal to sin(x+y). The output of the second adder is then produced to the second mixing stage of the Q component frequency corrected mixer module and, more specifically, to a Q component output mixer. The Q component output mixer further is coupled to receive the uncompensated local oscillation signal which is mixed with the Q component frequency corrected input received from the second adder. The Q component output mixer then produces the RF local oscillation frequency corrected output Q component signal.

The frequency correction stage, more generally, is coupled to receive I and Q component frequency correction inputs that are to be mixed with I and Q component phase locked loop oscillation signals. In one embodiment of the present invention, the phased locked loop oscillation signals that are received in the first mixing stage are divided by a factor, for example, 2, for reasons that assist with overall operation of the circuit (e.g., to avoid "pulling" by the local oscillator). The present circuit receives a divided local oscillation signal so that, when mixed with the uncompensated local oscillation signal, an output signal of a desired frequency is produced as the RF local oscillation frequency corrected signal. More specifically, if the uncompensated local oscillation signal is equal to ⅔ of a desired output frequency, and that signal is mixed with a divided local oscillation signal that is divided by 2, then the output signal will have a frequency that is equal to the sum of the uncompensated local oscillation signal and the divided local oscillation signal.

Figure 6:
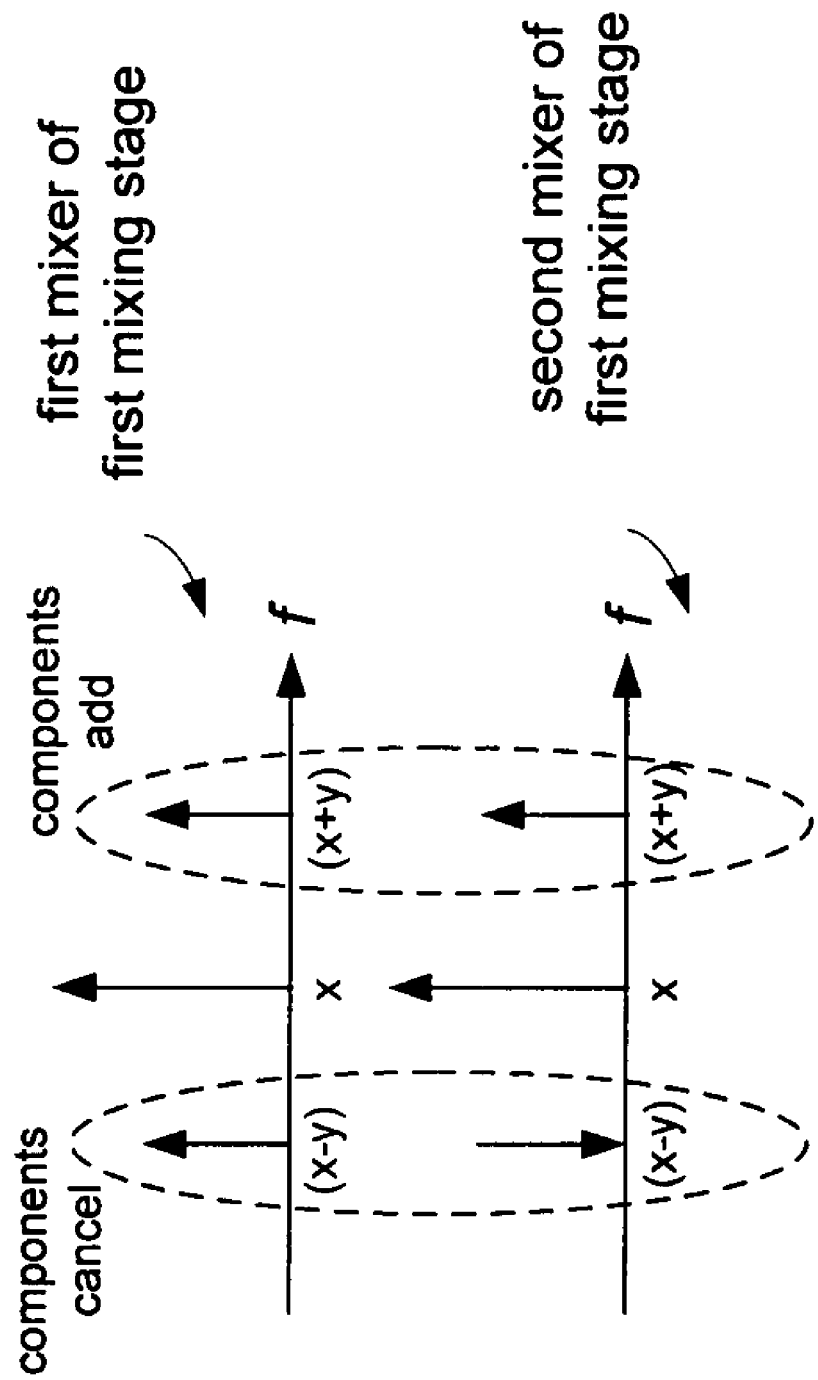
FIG. 6 is a diagram that illustrates the operation of the first mixing stage according to one embodiment of the present invention.

FIG. 6 is a diagram that illustrates the operation of a first mixing stage according to one embodiment of the present invention. As may be seen, a horizontal axis represents frequency while a vertical axis represents a signal having a magnitude at a specified frequency. A group of signals for the top portion of the diagram represent the output signals from a first mixer of the first mixing stage, while the signals in the bottom half of the diagram illustrate the output signals of a second mixer of the first mixing stage. More specifically, the signals shown at the center of each horizontal frequency axis represents frequency "x". To the left of frequency "x", the signals represent the frequency at (x−y). To the right of the center frequency, the signals represent the frequency of (x+y).

The direction of the arrows for each of the signals represents the signal magnitude. Thus, as may be seen, the signals at the frequency (x+y) are both positive and are therefore additive. On the other hand, the signals at the frequency (x−y) are opposite in magnitude thereby canceling each other out when summed with each other.

Figure 7:
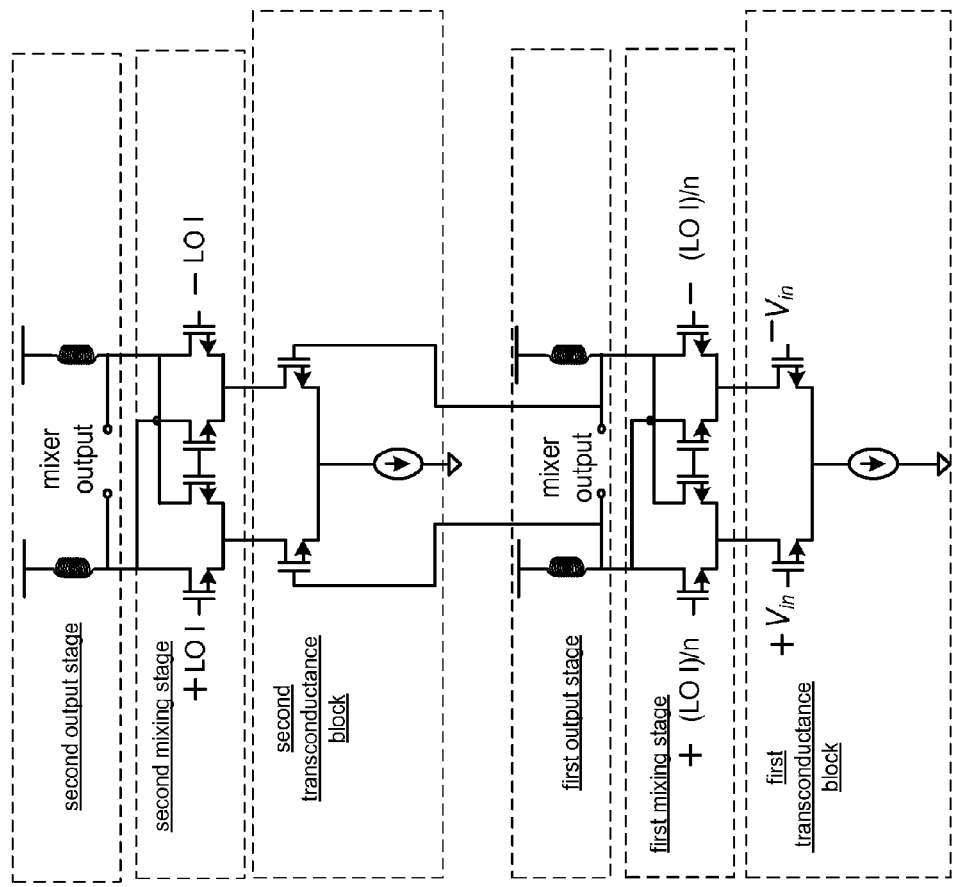
FIG. 7 illustrates one multi-stage mixer that may be used for a frequency correction stage in one embodiment of the invention.

FIG. 7 illustrates one multi-stage mixer that may be used for the inventive circuit of FIG. 5. As may be seen, the frequency mixer module includes first and second mixing stages. The multi-stage mixer further includes, for each of the first and second mixing stages, a corresponding a transconductance block and an output stage that converts an output current signal to an output voltage signal. The output voltage signal of the first output stage is produced to inputs of the second transconductance block coupled to produce a current signal to the second mixing stage. Accordingly, a voltage signal produced by the first output stage is converted to a current signal prior to mixing in the second mixing stage. As may be seen, each output stage of the first and second mixing stages includes a pair of inductive load devices for converting an output current signal into an output voltage signal.

Figure 8:
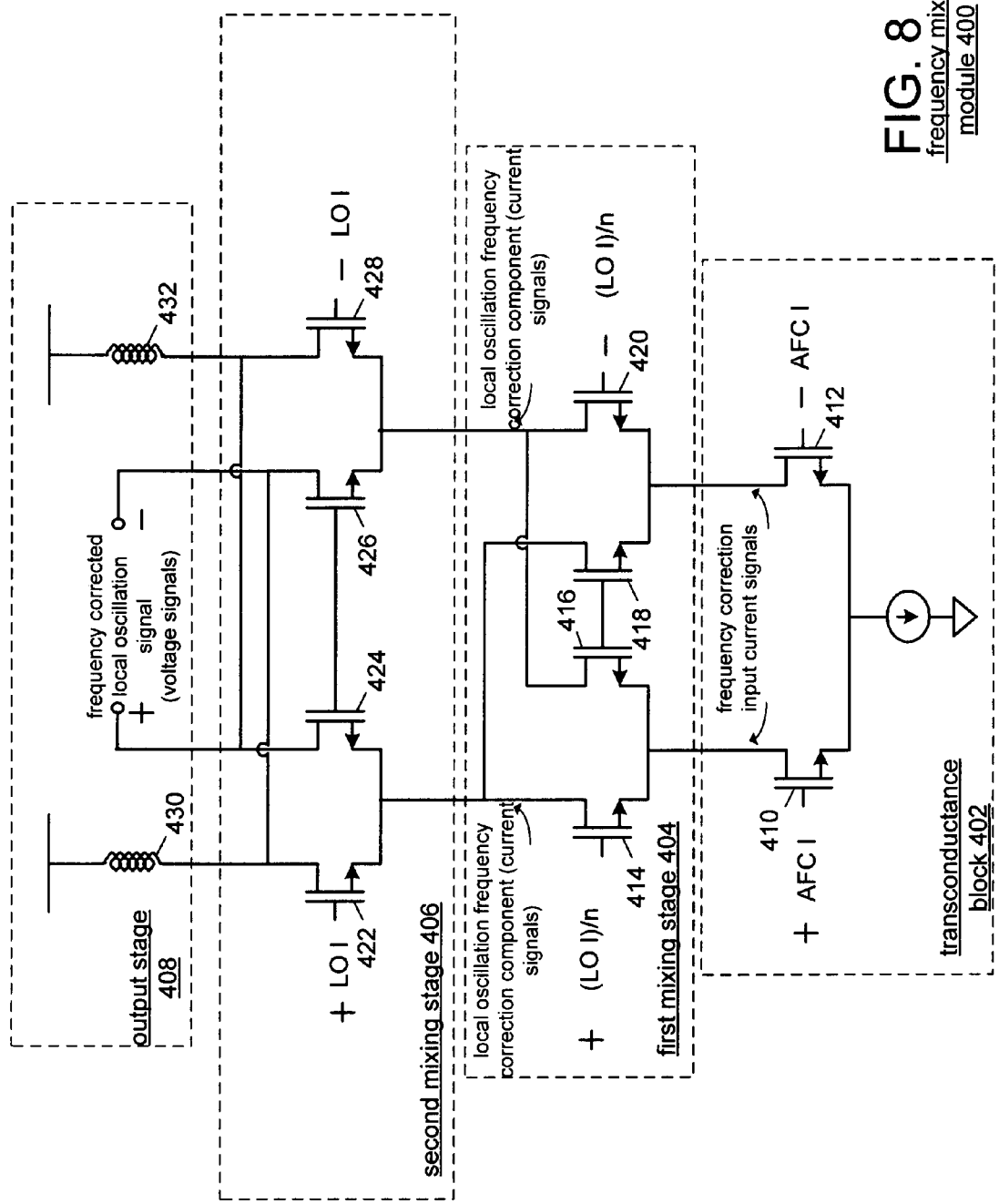
FIG. 8 illustrates a multi-stage mixer formed according to one embodiment of the invention.

FIG. 8 illustrates a multi-stage mixer formed according to one embodiment of the invention. The multi-stage mixer of FIG. 8 may also be used for the inventive circuit of FIG. 5 as well as other applications in which a multi-stage mixer is beneficial. The multi-stage mixer 400 of FIG. 8 comprises a transconductance block 402 coupled to produce a current signal to a first mixing stage 404. First mixing stage 404 produces a first mixed current signal to second mixing stage 406. Second mixing stage 406 then produces a second mixed current signal to output stage 408. Contrasting the multi-stage mixer of FIG. 8 with that of FIG. 7, it may be seen that one transconductance block comprising a pair of input devices and one output stage comprising a pair of inductive load devices is missing (not required) as the mixer of FIG. 7 includes a transconductance block and an output stage for each mixing stage. Accordingly, the associated power consumption and IC real estate associated with the missing transconductance block and output stage is saved thereby making the multi-stage mixer of FIG. 8 more efficient than that of FIG. 7.

More specifically, transconductance block 402 includes pair of input devices 410 and 412 for receiving a differential input signal. The differential signal may be, for example, a frequency correction input originated by a digital processor such as a baseband processor. One such application would be the frequency correction stage of FIG. 5 though other applications may also be implemented. Input devices 410 and 412 convert the input voltage signal to current signals that are produced to first mixing stage 404. First mixing stage 404 includes two differential pairs of devices for mixing (multiplying) the current signals produced by the transconductance block with a divided local oscillation signal (in the described embodiment though the invention should be limited to the inputs shown). More specifically, a first differential pair of first mixing stage includes devices 414 and 416 while a second differential pair of first mixing stage 404 includes devices 418 and 420. The sources of devices 414 and 416 are coupled to the drain of device 410 while the sources of devices 418 and 420 are coupled to the drain of device 412. The drains of devices 414 and 418 are coupled to provide a first input signal to second mixing stage 406 while the drains of devices 416 and 420 are coupled to provide a second input signal to second mixing stage 406. The gates of devices 416 and 418 are commonly coupled. Further, the first and second input signals jointly form the first mixed signal produced by first mixing stage 404.

Similarly, second mixing stage 406 comprises a first differential pair of devices 422 and 424 and a second differential pair of devices 426 and 428. The sources of devices 422 and 424 are commonly coupled to receive the first input signal produced by devices 414 and 418 while the sources of devices 426 and 428 are commonly coupled to receive the second input signal produced by devices 416 and 420. The gates of devices 424 and 426 are commonly coupled while the gates of devices 422 and 428 are coupled to receive a local oscillation (the local oscillation being corrected in the described embodiment).

The drains of devices 422 and 426 are commonly coupled to produce a first output current signal to output stage 408 while the drains of devices 424 and 428 are commonly coupled to produce a second output current signal to output stage 408. Output stage 408 includes a first inductive load device 430 and a second inductive load device 432. Load device 430 is coupled to receive the first output current signal and load device 432 is coupled to receive the second output current signal. A differential output port is coupled to load devices 430 and 432 and to the drains of devices 422 and 426 and to the drains of devices 424 and 428, respectively. The first and second output current signals jointly form the second mixed signal.

In operation, the input devices of transconductance block 402 receive a frequency correction input (in one application of the inventive circuitry) and produce current signals to first mixing stage 404. The current signals produced by transconductance block 402 are multiplied with inputs received at the first mixing stage differential inputs. The resulting product from the multiplication is produced to second mixing stage 406 as current signals where they are multiplied with inputs received at the second mixing stage differential inputs. The resulting product from the second mixing stage is then produced to the output stage where the inductive load devices convert the output current signals into output voltage signals.

The described embodiments of the invention utilize inductive load devices though other devices may be used in other applications. The load devices may be, for example, resistive devices. The products produced at each mixing stage may, mathematically, be as described previously in the text for FIG. 5. Each input signal may be represented by a sine or cosine function according to whether it is an in-phase or quadrature phase input signal. Generally, though, the output signal will have a frequency component that is a sum of the local oscillation signal received at the second mixing stage, the divided local oscillation received at the first mixing stage and the frequency correction input signal received at the transconductance block.

Figure 9:
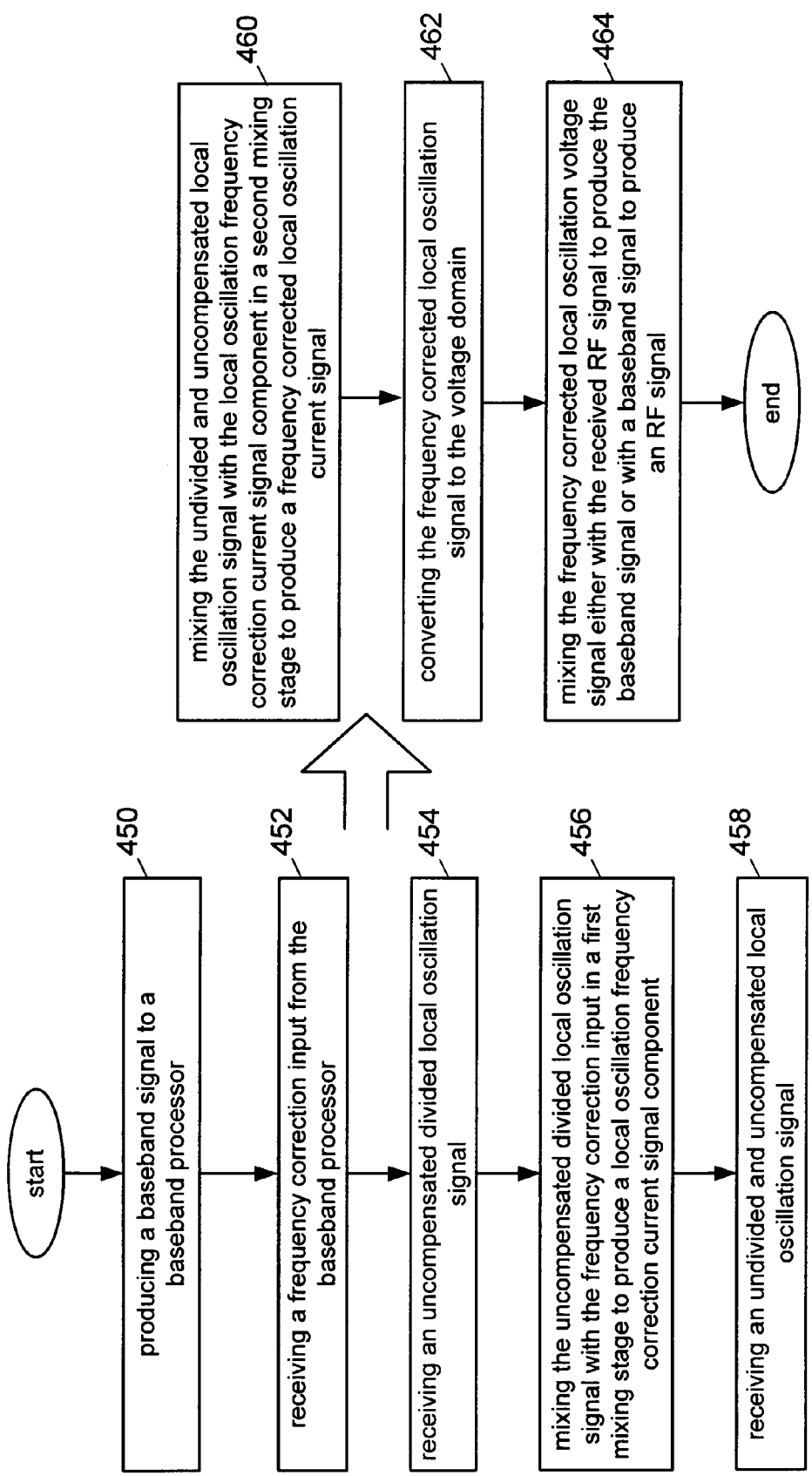
FIG. 9 is a flowchart illustrating a method for producing a frequency compensated local oscillation signal for mixing with an RF signal or with a baseband or low intermediate frequency signal for down-converting or up-converting, respectively, according to one embodiment of the invention.

FIG. 9 is a flowchart illustrating a method for producing a frequency compensated local oscillation signal for mixing with an RF signal or with a baseband or low intermediate frequency signal for down-converting or up-converting, respectively. In a Radio Frequency (RF) transceiver mixer module, a method for down-converting a received RF signal includes initially producing a baseband signal to a baseband processor (step 450) and receiving a frequency correction input therefrom (step 452). Until and before a steady state is reached, an uncompensated local oscillation is used to down convert a received RF signal. The baseband processor then determines an amount of necessary correction and provides the frequency correction input to the multi-stage mixer. Thereafter, the inventive process includes receiving an uncompensated divided local oscillation signal (step 454) and mixing the uncompensated divided local oscillation signal with the frequency correction input in a first mixing stage to produce a local oscillation frequency correction current signal component (step 456). The step of receiving the uncompensated divided local oscillation signal includes, in one embodiment, the step of dividing the undivided and uncompensated local oscillation signal to produce the uncompensated divided local oscillation signal. The local oscillation frequency correction current signal component is then produced directly to a second mixing stage without converting the output from a current signal to a voltage signal. Thus, the invention further includes receiving an undivided and uncompensated local oscillation signal (step 458) and mixing the undivided and uncompensated local oscillation signal with the local oscillation frequency correction current component in a second mixing stage to produce a frequency corrected local oscillation current signal (step 460). The local oscillation frequency correction component is produced to the second mixing stage without converting the local oscillation frequency correction component from the current domain to the voltage domain.

Finally, the invention includes converting the frequency corrected local oscillation signal to a voltage signal (step 462) to produce a frequency corrected local oscillation for mixing with a baseband or low IF signal to produce an upconverted RF signal or to produce a down converted baseband or low IF signal. Thus, the invention, when used with a transceiver, includes mixing the frequency corrected local oscillation voltage signal with the received RF signal to produce the baseband signal without converting the local oscillation frequency correction component from the current domain to the voltage domain (step 464). Generally, the above two mixing steps occur without converting signals between the current and voltage domains.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A multi-stage mixer module, comprising:
a first frequency mixing stage coupled to receive a first reference signal and a first mixing stage input signal, the first mixing stage producing a second mixing stage input signal;
a second frequency mixing stage coupled to receive a second reference signal and the second mixing stage input signal, the second mixing stage producing a second mixing stage output signal wherein a sum of a frequency value of the first reference signal, when added to a frequency value of the second reference signal, is equal to an uncompensated local oscillation signal frequency value; and
an output stage coupled to receive the second mixing stage output signal, the output stage for converting the second mixing stage output signal from a current form to a voltage form to produce a multi-stage mixer module output signal.

2. The multi-stage mixer module of claim 1 wherein the first reference signal is characterized by a frequency that is twice a frequency of the second reference signal.

3. The multi-stage mixer module of claim 1 wherein the second reference signal is characterized by a frequency that is twice a frequency of the first reference signal.

4. The multi-stage mixer module of claim 1 that further comprises:
a transconductance block for receiving an input signal having a frequency, the transconductance block for converting the input signal from a voltage form to a current form to produce the first mixing stage input signal in a current domain.

5. The multi-stage mixer module of claim 1 wherein the input signal comprises a frequency correction input for mixing with the uncompensated local oscillation signal frequency to produce a frequency compensated local oscillation signal.

6. A radio frequency (RF) transceiver integrated circuit, comprising:
a local oscillator that generates an RF local oscillation signal corresponding to an RF channel;
a receiver section operably coupled to the local oscillator to receive the RF local oscillation signal, wherein the receiver section receives an incoming RF signal, and wherein the receiver section down-converts the incoming RF signal based upon the RF local oscillation signal to produce an incoming baseband signal;
a transmitter section operably coupled to the local oscillator to receive the RF local oscillation signal, wherein the transmitter section receives an outgoing baseband signal, and wherein the transmitter section up-converts the outgoing baseband signal to produce an outgoing RF signal; and
wherein the local oscillator further comprises:
a phase locked loop that generates a phase locked loop oscillation signal;
a divider circuit that receives the phase locked loop oscillation signal to produce a divided phase locked loop oscillation signal; and
a two step mixing stage that receives the phase locked loop oscillation signal, the divided phase locked loop oscillation signal and a frequency correction input, wherein the two step mixing stage:
mixes the frequency correction input with the divided phase locked loop oscillation signal to create a local oscillation frequency correction component; and
mixes the local oscillation frequency correction component with the phase locked loop oscillation signal to produce a frequency corrected local oscillation signal.

7. The RF transceiver integrated circuit of claim 6 wherein the divider circuit produces the divided phase locked loop oscillation signal with a frequency that is one half of the phase locked loop oscillation signal.

8. The RF transceiver integrated circuit of claim 6 wherein the divider circuit produces the divided phase locked loop oscillation signal with a frequency that is one third of the phase locked loop oscillation signal.

9. The RF transceiver integrated circuit of claim 6 wherein a sum frequency value of a frequency value of the divided phase locked loop oscillation signal and a frequency value of the phase locked loop oscillation signal is equal to a desired uncompensated local oscillation frequency value.

10. The RF transceiver integrated circuit of claim 6, wherein the frequency correction input is received from a coupled baseband processor.

11. The RF transceiver integrated circuit of claim 6, further comprising a baseband processor, wherein:
the baseband processor is coupled to receive an incoming baseband signal;
the baseband processor determines the frequency correction input from the incoming baseband signal; and
the baseband processor provides the frequency correction input to the local oscillator.

12. In a Radio Frequency (RF) transceiver mixer module, a method for down-converting a received RF signal, comprising:
producing a baseband signal to a baseband processor;
receiving a frequency correction input from the baseband processor;
receiving an uncompensated divided local oscillation signal;
mixing the uncompensated divided local oscillation signal with the frequency correction input in a first mixing stage to produce a local oscillation frequency correction component;
receiving an undivided and uncompensated local oscillation signal;
mixing the undivided and uncompensated local oscillation signal with the local oscillation frequency correction component in a second mixing stage to produce a frequency corrected local oscillation signal; and
mixing the frequency corrected local oscillation voltage signal either with the received RF signal to produce the baseband signal or with a baseband signal to produce an RF signal.

13. The method of claim 12 further including the step of dividing the undivided and uncompensated local oscillation signal to produce the uncompensated divided local oscillation signal.

14. The method of claim 12 wherein the local oscillation frequency correction component is produced to the second mixing stage.

15. The method of claim 12 further including converting the frequency corrected local oscillation signal to a voltage signal.

16. A radio frequency (RF) transceiver integrated circuit, comprising:
   a local oscillator that generates an RF local oscillation signal corresponding to an RF channel;
   a receiver section operably coupled to the local oscillator to receive the RF local oscillation signal, wherein the receiver section receives an incoming RF signal, and wherein the receiver section down-converts the incoming RF signal based upon the RF local oscillation signal to produce an incoming baseband signal;
   a transmitter section operably coupled to the local oscillator to receive the RF local oscillation signal, wherein the transmitter section receives an outgoing baseband signal, and wherein the transmitter section up-converts the outgoing baseband signal to produce an outgoing RF signal; and
   wherein the local oscillator further comprises:
      a phase locked loop that generates a phase locked loop oscillation signal;
      a divider circuit that receives the phase locked loop oscillation signal to produce a divided phase locked loop oscillation signal; and
      a two step mixing stage that receives the phase locked loop oscillation signal, the divided phase locked loop oscillation signal and a frequency correction input, wherein the two step mixing stage further includes:
         first and second mixer MOSFETs, the first and second mixer MOSFETs having commonly connected source terminals that are further coupled to a drain terminal of the first mixer MOSFET and further including a drain terminal and a gate terminal wherein the first mixer MOSFET receives a divided phase locked loop oscillation signal and mixes the frequency correction input in the current domain with the divided phase locked loop oscillation signal received at the gate terminal to create a local oscillation frequency correction component at the drain terminal of the first mixer MOSFET; and
         third and fourth mixer MOSFETS having commonly connected source terminals that are further coupled to a drain terminal of the first mixer MOSFET and further including a drain terminal and a gate terminal wherein the third mixer MOSFET receives an undivided and uncompensated phase locked loop oscillation signal and mixes the local oscillation frequency correction component in the current domain with the undivided and uncompensated phase locked loop oscillation signal received at the gate terminal of the third mixer MOSFET to create a compensated local oscillation at the drain terminal of the third mixer MOSFET; and
         an output stage comprising an inductive coil coupled to the drain terminal of the third mixer MOSFET to that produces the RF local oscillation signal in a voltage form.

17. A direct conversion Radio Frequency (RF) transceiver integrated circuit, comprising:
   local oscillator means for generating a frequency corrected local oscillation corresponding to an RF channel;
   receiver means operably coupled to the local oscillator means to receive the frequency corrected local oscillation and that receives an incoming RF signal, the receiver means also for down-converting the incoming RF signal based upon the frequency corrected local oscillation to produce an incoming baseband signal;
   transmitter means operably coupled to receive an outgoing baseband signal, the transmitter means for producing an outgoing RF signal; and
   wherein the local oscillator means further comprises a two step mixing stage that:
      receives an oscillation, a divided oscillation and a frequency correction input;
      in a transconductance stage, creates a frequency correction input current signal based on the frequency correction input;
      mixes the frequency correction input current signal with the divided oscillation to create a local oscillation frequency correction component current signal; and
      mixes the local oscillation frequency correction component with the oscillation to produce a frequency corrected local oscillation current signal; and
      converts the frequency corrected local oscillation current signal into a voltage signal to produce the frequency corrected local oscillation.

18. The RF transceiver integrated circuit of claim 17, wherein the local oscillator means further comprises a phase locked loop that generates the oscillation.

19. The RF transceiver integrated circuit of claim 17, wherein the local oscillator means further comprises:
   a divider circuit that receives the oscillation to produce the divided oscillation.

20. The RF transceiver integrated circuit of claim 17, wherein the local oscillator means further comprises:
   a phase locked loop that generates the oscillation;
   a divider circuit that receives the oscillation to produce the divided oscillation;
   a first mixing stage that mixes the divided oscillation with the frequency correction input to produce an intermediate stage corrected oscillation; and
   a second mixing stage that mixes the intermediate stage corrected oscillation with the oscillation to produce the frequency corrected local oscillation.

21. The RF transceiver integrated circuit of claim 20, further comprising a baseband processor, wherein:
   the baseband processor is coupled to receive the incoming baseband signal;
   the baseband processor determines the frequency correction input from the incoming baseband signal; and
   the baseband processor provides the frequency correction input to the local oscillator means.

* * * * *